(12) United States Patent
Yamagata

(10) Patent No.: US 6,515,922 B1
(45) Date of Patent: Feb. 4, 2003

(54) MEMORY MODULE

(75) Inventor: Tadato Yamagata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/621,693

(22) Filed: Jul. 21, 2000

(30) Foreign Application Priority Data

Jan. 24, 2000 (JP) .......................................... 2000-01449

(51) Int. Cl.[7] .................................................. G11C 7/00
(52) U.S. Cl. ................................... 365/201; 365/189.08
(58) Field of Search ............................. 365/201, 189.08

(56) References Cited

U.S. PATENT DOCUMENTS

| 4,897,817 | A | * | 1/1990 | Katanosaka | .................. | 365/201 |
| 5,636,163 | A | * | 6/1997 | Furutani | .................. | 365/189.01 |
| 6,275,961 | B1 | * | 8/2001 | Roohparvar | .............. | 365/185.2 |

FOREIGN PATENT DOCUMENTS

| JP | 61-261895 | 11/1986 |
| JP | 61-292300 | 12/1986 |

OTHER PUBLICATIONS

"184–Pin DDR Registered SDRAM DIMM Product Overview", IBM Corporation, p. 26.
"PC SDRAM Registered DIMM Design Support Document", Intel, p. 31.

* cited by examiner

*Primary Examiner*—A. Zarabian
(74) *Attorney, Agent, or Firm*—McDermott, Will & Emery

(57) ABSTRACT

A memory module is provided with switch groups (SD0*a* to SD7*a*) in corresponding relation to data lines (DQ0 to DQ63) connected to memory devices (MD0 to MD7). The switch groups (SD0*a* to SD7*a*) connect all of the data lines (DQ0 to DQ63) to a portion external to the memory module (MMa) in a memory operation, and connect all of the data lines (DQ0 to DQ63) to inputs of an exclusive NOR circuit (EXa) after common 1-bit data is written into the memory devices (MD0 to MD7) in a testing operation. A malfunction of the memory devices (MD0 to MD7) is detected using an output signal (TMSa) from the exclusive NOR circuit (EXa). The memory module is accomplished which allows an inexpensive tester to conduct an electrical assembly check and a simple data write and read operation test upon the memory devices, which includes a small number of I/O pins for the check and test, and which does not deteriorate data input/output characteristics of the memory devices.

17 Claims, 11 Drawing Sheets

F I G . 4
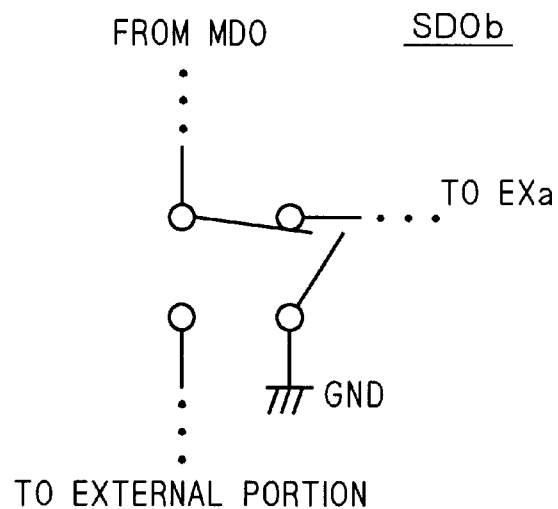
F I G . 5
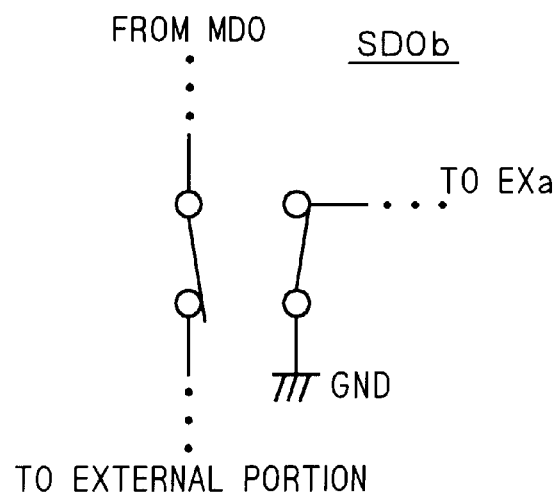

F I G. 8
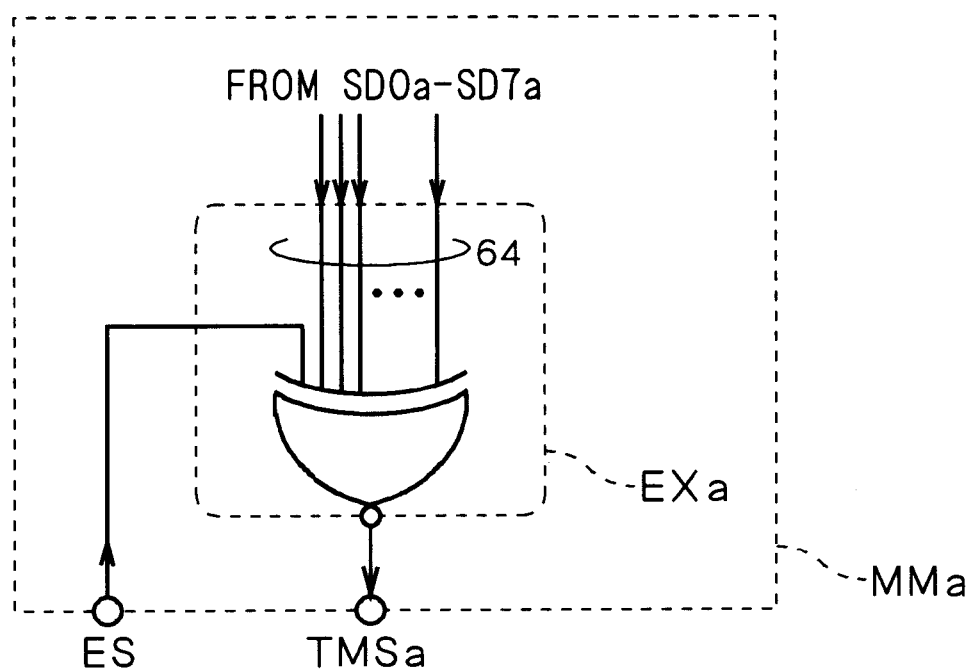

| $\overline{QFC}$ | TME | SD0a |
|---|---|---|
| L | L | |
| L | H | |
| H | L | |
| H | H | |

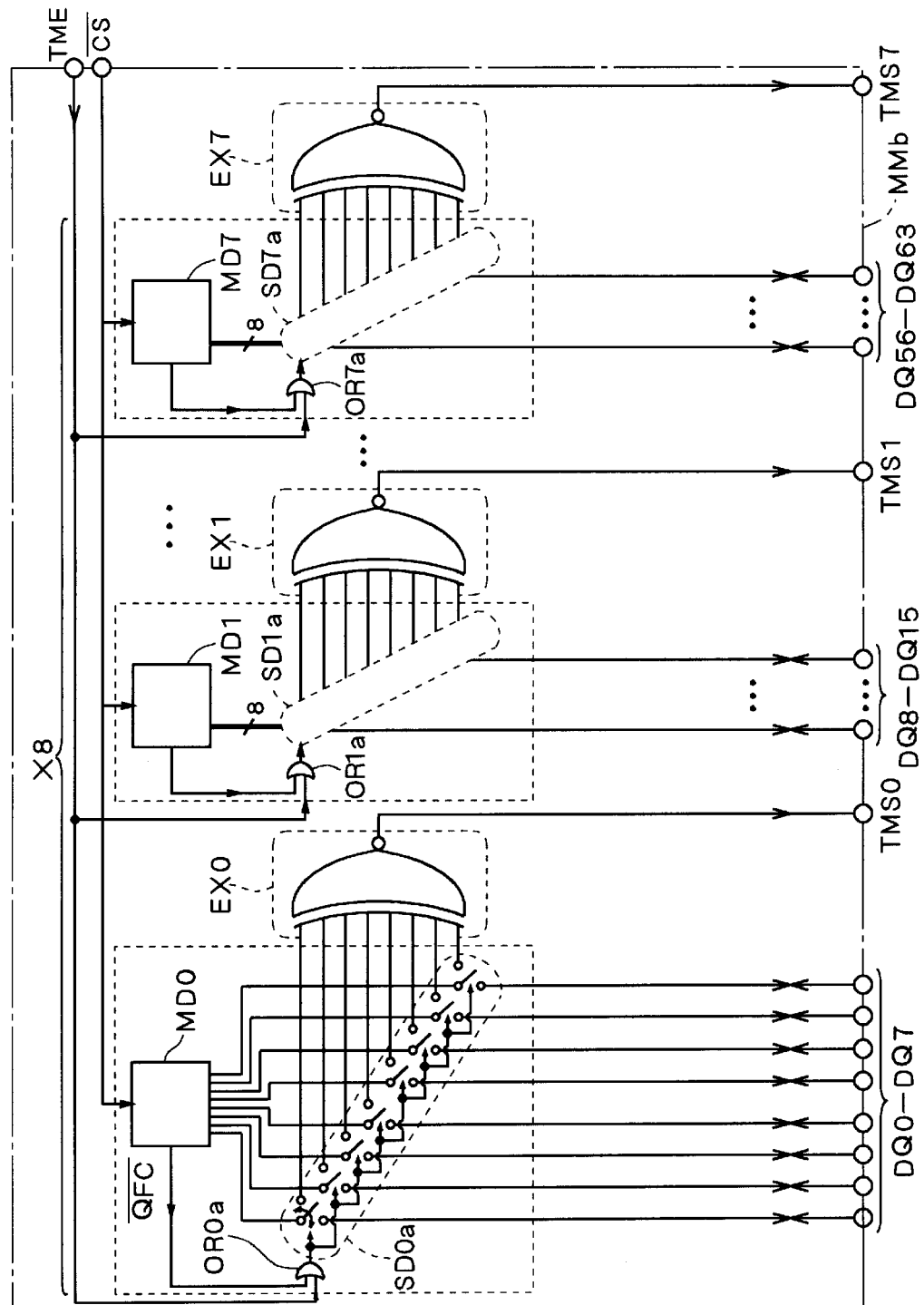
F I G. 12

MEMORY MODULE

BACKGROUND OF THE INVENTION

1. Field of the Invention

The present invention relates to a memory module including a multiplicity of memory devices such as SDRAMs (Synchronous Dynamic Random Access Memories) formed on a substrate.

2. Description of the Background Art

FIG. 13 shows a background art memory module. The memory module MMc of FIG. 13 comprises eight memory devices MD0 to MD7 formed on a memory module substrate. A memory device, as that term is used herein, is a storage element in the form of a chip. As an example, eight data lines DQ0 to DQ7 are connected to the memory device MD0, and data lines DQ8 to DQ15 are connected to the memory device MD1. Likewise, data lines are connected to each of the other memory devices MD2 to MD7. The data lines DQ0 to DQ63 serve as transmission paths for transmitting and receiving data to and from a portion external to the memory module MMc during a memory operation such as bit-wise writing and reading of data into and from a memory cell in each of the memory devices MD0 to MD7 and a refresh operation. The memory devices MD0 to MD7 are also connected to signal lines, not shown, for transmitting operating signals such as a write enable signal and an address signal for the memory operation in addition to the data lines DQ0 to DQ63.

Thus, the memory module has such a large number of signal lines for connection to the memory devices, and these signal lines are connected to the external portion through I/O pins provided on the memory module substrate.

Memory modules, after being manufactured, are generally inspected by some tests such as an electrical assembly check for judging whether or not interconnect lines are formed well, a data write and read operation test, and a memory content retention operation check.

However, the increased number of I/O pins of the memory module as above described has required an expensive tester having a great number of I/O pins even when the electrical assembly check and the simple data write and read operation test (e.g., a write operation which applies "1" or "0" to all data lines and a subsequent read operation) are performed. The tester having a great number of I/O pins is expensive since the tester includes a data write driver and a data read comparator for each of the I/O pins.

Thus, there arises a need for a memory module which allows an inexpensive tester to carry out the electrical assembly check and the simple data write and read operation test on the memory devices.

A technique for conducting the above described tests on a single memory device, rather than the memory module, is disclosed in, for example, Japanese Patent Application Laid-Open Nos. P61-261895A and P61-292300A (1986).

FIG. 14 shows a technique disclosed in Japanese Patent Application Laid-Open No. P61-261895A. In this technique, data lines 111 establish connection between a memory array 101 and a multiplexer 102, and data from the memory array 101 is outputted through the multiplexer 102. An output from the multiplexer 102 is outputted through a switching circuit 103 for switching between the memory operation and a testing operation, an output buffer 104 and an output pad 105 to an external portion. An exclusive OR circuit 106 is also connected to the memory array 101 through data lines 112. The exclusive OR circuit 106 conducts tests on the memory array 101.

Operation in this technique is described below. In the memory operation, a signal $\phi_1$ inputted to the switching circuit 103 is "0," and the output from the multiplexer 102 is applied to the output buffer 104 independently of an output from the exclusive OR circuit 106.

In the testing operation, on the other hand, the signal $\phi_1$ inputted to the switching circuit 103 is "1." The same 1-bit data (e.g., "1") is written into all memory cells to be tested in the memory array 101. The exclusive OR circuit 106 receives a 1-bit data signal $\phi_2$ which is the same as the data written into the memory array 101 and outputs from the data lines 112 to perform an exclusive OR operation thereon.

In the event of imperfect interconnect formation or a data read and write malfunction in the memory array 101, there is a high possibility that data other than "1" appears on one of the data lines 112. Therefore, the memory array 101 is judged as being normal when the output from the exclusive OR circuit 106 is "0," i.e., all inputs to the exclusive OR circuit 106 are the same 1-bit data. On the other hand, the memory array 101 is judged as being defective when the output from the exclusive OR circuit 106 is "1." In this manner, whether the memory device is good or not is examined.

The use of this technique allows an inexpensive tester including a single comparator to conduct the electrical assembly check and the simple data write and read operation test on the memory device.

This technique may be applied to a memory module to accomplish the memory module on which an inexpensive tester can conduct the above described tests. Specifically, the memory device shown in FIG. 14 may be used as a device to be mounted in the memory module.

However, simply mounting this memory device into the memory module is not sufficient, but it is necessary that output signals TMS0 to TMS7 are outputted from the memory devices MD0 to MD7, respectively, as in a memory module MMd shown in FIG. 15, for example. Thus, there is a limit to the use of an inexpensive tester having a smaller number of I/O pins.

Additionally, a testing circuit provided in a memory device as in the above described technique is not always capable of conducting perfect tests since, in some tests, the signals from the memory array 101 bypass a circuit through which those signals pass during the memory operation. For instance, since the multiplexer 102 is bypassed during the testing operation in the arrangement shown in FIG. 14, it is impossible to test the entire device including the operation of the multiplexer 102.

Further, the direct connection of the exclusive OR circuit 106 to test to the memory array 101 as in the memory device shown in FIG. 14 causes an input load of the exclusive OR circuit 106 to be imposed on the memory array 101 during the memory operation, thereby requiring an additional driving capability when the memory array 101 outputs data. Moreover, signal reflection is prone to occur on the data lines 111, resulting in deterioration of data I/O characteristics.

The provision of the testing circuit in the memory device presents another problem of increasing the chip size of the memory device itself, resulting in increased costs.

The technique disclosed in Japanese Patent Application Laid-Open No. P61-292300A (1986) has similar problems.

SUMMARY OF THE INVENTION

According to a first aspect of the present invention, a memory module comprises: at least one memory device connected to at least one data line for bit-wise transmitting and receiving data to and from an external portion; an exclusive OR element having at least one input corresponding to the at least one data line; and at least one switch for connecting the at least one data line to the external portion and the at least one input of the exclusive OR element, wherein the at least one switch receives a first instruction for causing the at least one switch to connect the at least one data line to the at least one input of the exclusive OR element in a testing operation and causing the at least one switch to connect the at least one data line to the external portion in a memory operation.

Preferably, according to a second aspect of the present invention, in the memory module of the first aspect, in the testing operation, common 1-bit data is applied to the at least one data line and stored in the at least one memory device before the first instruction causes the at least one switch to connect the at least one data line to the at least one input of the exclusive OR element, and thereafter whether the at least one memory device malfunctions or not is judged by checking an output from the exclusive OR element.

Preferably, according to a third aspect of the present invention, in the memory module of the first aspect, at least one memory device includes a plurality of memory devices; and the exclusive OR element and the at least one switch are provided in corresponding relation to each of the plurality of memory devices.

Preferably, according to a fourth aspect of the present invention, in the memory module of the first or third aspect, the at least one switch further connects the at least one input of the exclusive OR element to a fixed potential in the memory operation.

Preferably, according to a fifth aspect of the present invention, in the memory module of the first or third aspect, an operating signal for controlling the at least one memory device is inputted from the external portion to the at least one memory device; and the at least one memory device performs the memory operation when the operating signal is in a pre-defined significant condition. The memory module further comprises control means for providing the first instruction to the at least one switch, the control means placing the at least one switch into a condition achieved in the testing operation when the operating signal is in a predetermined condition other than the significant condition.

Preferably, according to a sixth aspect of the present invention, in the memory module of the fifth aspect, the operating signal includes a plurality of operating signals; and the control means places the at least one switch into the condition achieved in the testing operation when a predetermined one of combinations of the plurality of operating signals which does not contribute to the memory operation is inputted to the control means.

Preferably, according to a seventh aspect of the present invention, in the memory module of the first or third aspect, the exclusive OR element further has another input capable of receiving arbitrary 1-bit data.

Preferably, according to an eighth aspect of the present invention, in the memory module of the first or third aspect, an operating signal for selecting the at least one memory device is inputted from the external portion to the at least one memory device; and an unselected one of the at least one memory device provides a second instruction to the at least one switch to prevent the at least one data line from being connected to the external portion.

Preferably, according to a ninth aspect of the present invention, the memory module of the eighth aspect further comprises an OR element receiving the first and second instructions, wherein the at least one switch is controlled by an output from the OR element.

According to a tenth aspect of the present invention, a memory module comprises: a memory device; and control means, wherein an operating signal for controlling the memory device is inputted from an external portion to the memory device; wherein the memory device performs a memory operation when the operating signal is in a pre-defined significant condition; and wherein the control means outputs a signal regarding a predetermined operation differing from the memory operation when the operating signal is in a predetermined condition other than the significant condition.

Preferably, according to an eleventh aspect of the present invention, in the memory module of the tenth aspect, the operating signal includes a plurality of operating signals; and the control means outputs the signal regarding the predetermined operation when a predetermined one of combinations of the plurality of operating signals which does not contribute to the memory operation is inputted to the control means.

In accordance with the first aspect of the present invention, the at least one switch connects the at least one data line to the at least one input of the exclusive OR element in the testing operation, and connects the at least one data line to the external portion in the memory operation. Therefore, in the testing operation, an electrical assembly check and a simple data write and read operation test may be conducted on the at least one memory device by observing the output from the exclusive OR element. In the memory operation, since the at least one input of the exclusive OR element is not connected to the at least one data line, an additional load is not imposed on the at least one data line, and signal reflection does not occur on the at least one data line.

In accordance with the second aspect of the present invention, in the testing operation, whether the at least one memory device malfunctions or not is judged by checking the output from the exclusive OR element after the common 1-bit data is applied to the at least one data line and stored in the at least one memory device. Therefore, the electrical assembly check and the simple data write and read operation test may be easily conducted on the at least one memory device.

In accordance with the third aspect of the present invention, the exclusive OR element and the at least one switch are provided in corresponding relation to each of the plurality of memory devices. Therefore, which memory device malfunctions is determined.

In accordance with the fourth aspect of the present invention, the at least one switch further connects the at least one input of the exclusive OR element to the fixed potential in the memory operation. This suppresses power consumption resulting from a stray capacitance and noise at the at least one input of the exclusive OR element.

In accordance with the fifth aspect of the present invention, the control means provides the first instruction to the at least one switch, and places the at least one switch into the condition achieved in the testing operation when the operating signal is in the predetermined condition other than the significant condition. This eliminates the need for the memory module to include an additional input pin for the first instruction, and also reduces the number of interconnect lines of a system board to which the memory module is to be connected.

In accordance with the sixth aspect of the present invention, the at least one switch is placed into the condition achieved in the testing operation when a predetermined one of combinations of the plurality of operating signals which does not contribute to the memory operation is inputted. This permits effective use of the predetermined combination of the operating signals which does not contribute to the memory operation.

In accordance with the seventh aspect of the present invention, the exclusive OR element further has the additional input capable of receiving the arbitrary 1-bit data. Thus, the at least one memory device may be tested for malfunction, based on whether or not the output from the at least one data line coincides with the arbitrary 1-bit data applied to the additional input even in the event of a malfunction such that the output from every one of the at least one data line is inverted.

In accordance with the eighth aspect of the present invention, an unselected one of the at least one memory device provides the second instruction to the at least one switch to prevent the at least one data line from being connected to the external portion. There is no need to additionally provide a separate bus switch.

In accordance with the ninth aspect of the present invention, the at least one switch is controlled by the output from the OR element which receives the first and second instructions. Therefore, the at least one switch is required to receive only the single instruction.

In accordance with the tenth aspect of the present invention, the control means outputs the signal regarding the predetermined operation differing from the memory operation when the operating signal is in the predetermined condition other than the significant condition. This eliminates the need for the memory module to include an additional pin for input of the signal regarding the predetermined operation, and also reduces the number of interconnect lines of a system board to which the memory module is to be connected.

In accordance with the eleventh aspect of the present invention, the control means outputs the signal regarding the predetermined operation when a predetermined one of combinations of the plurality of operating signals which does not contribute to the memory operation is inputted to the control means. This permits effective use of the predetermined combination of the operating signals which does not contribute to the memory operation.

It is therefore an object of the present invention to provide a memory module Which allows an inexpensive tester to conduct an electrical assembly check and a simple data write and read operation test upon memory devices thereof, which includes a smaller number of I/O pins for the check and test, and which does not deteriorate data input/output characteristics of the memory devices.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a memory module according to a first preferred embodiment of the

FIGS. 4 and 5 show the operation of a switch group SD0*b* in the memory module according to the third preferred embodiment;

FIG. 8 shows a memory module according to a fifth preferred embodiment of the present invention;

FIG. 12 shows a memory module according to a seventh preferred embodiment of the present invention;

DESCRIPTION OF THE PREFERRED EMBODIMENTS

<First Preferred Embodiment>

Figure 1:
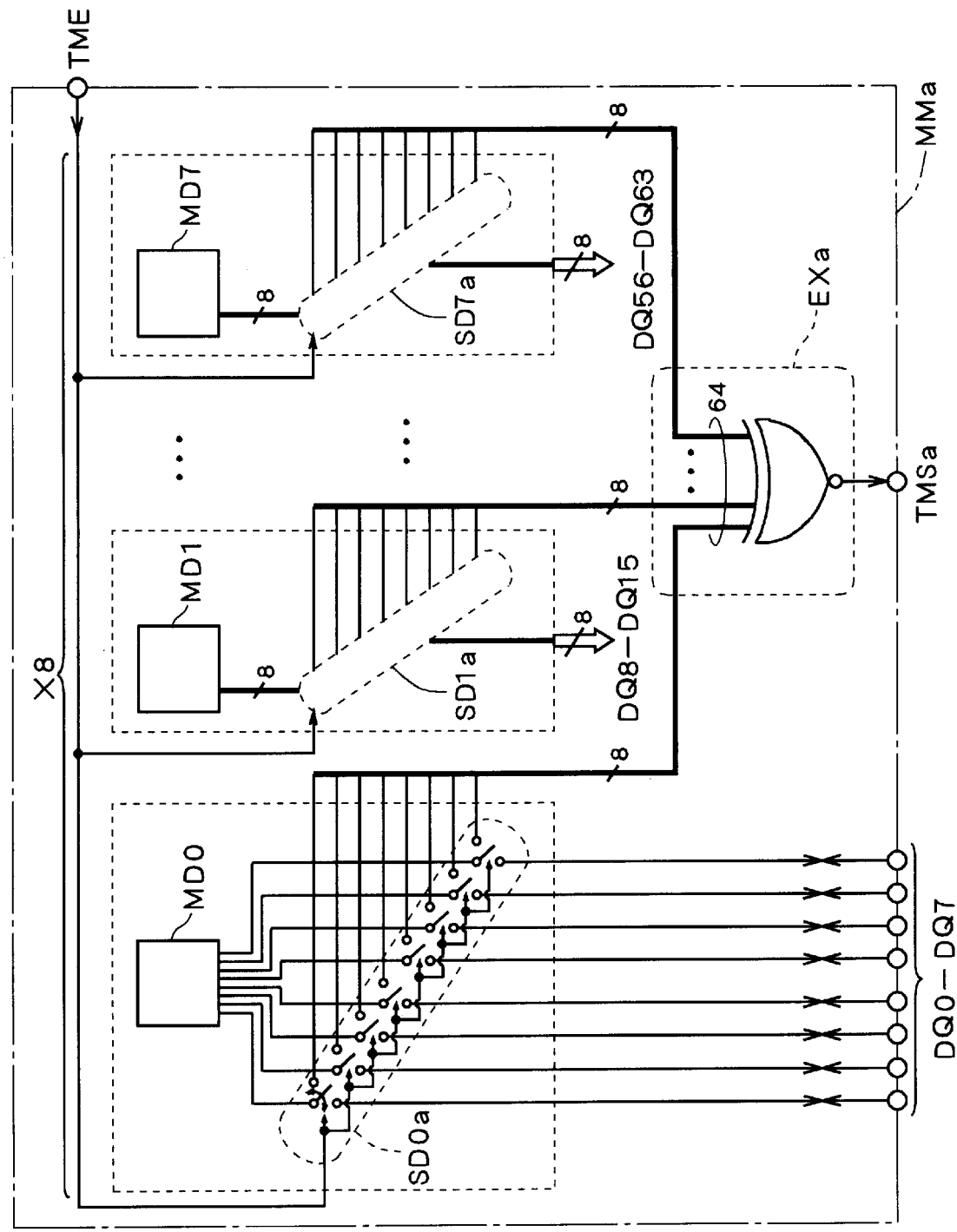

FIG. 1 shows a memory module MMa according to a first preferred embodiment of the present invention. As illustrated in FIG. 1, the memory module MMa, similar to the background art memory module MMc, comprises, for example, eight memory devices MD0 to MD7 formed on a memory module substrate. A memory device, as that term is used herein, is a storage element in the form of a chip. As an example, eight data lines DQ0 to DQ7 are connected to the memory device MD0, and data lines DQ8 to DQ15 are connected to the memory device MD1. Likewise, data lines are connected to each of the other memory devices MD2 to MD7. The data lines DQ0 to DQ63 serve as transmission paths for transmitting and receiving data to and from a portion external to the memory module MMa during a memory operation such as bit-wise writing and reading of data into and from a memory cell in each of the memory devices MD0 to MD7 and a refresh operation. The memory devices MD0 to MD7 are also connected to signal lines, not shown, for transmitting operating signals such as a write enable signal and an address signal for the memory operation in addition to the data lines DQ0 to DQ63.

The memory module MMa further comprises an exclusive NOR circuit EXa having inputs connected respectively to the data lines DQ0 to DQ63 connected to the memory devices MD0 to MD7. The data lines DQ0 to DQ63 are connected selectively to one of the portion external to the memory module MMa and the exclusive NOR circuit EXa, not to both at the same time.

For the selective connection, the memory module MMa further comprises switch groups SD0*a* to SD7*a* provided in corresponding relation to the data lines DQ0 to DQ63. Each of the switch groups SD0*a* to SD7*a* includes a plurality of switches each receiving a testing operation enable signal TME. These switches are individually operable to connect the data lines DQ0 to DQ63 to the inputs of the exclusive NOR circuit EXa when the testing operation enable signal TME is active, and to connect the data lines DQ0 to DQ63 through I/O pins provided on the memory module substrate to the portion external to the memory module MMa when the testing operation enable signal TME is inactive.

The exclusive NOR circuit EXa and each of the switches of the switch groups SD0a to SD7a may be in the form of a single device. Alternatively, some or all of these elements may be combined to form a device.

Operation of the memory module MMa will be described hereinafter. In the memory operation, the testing operation enable signal TME is inactive, and the switch groups SD0a to SD7a connect all of the data lines DQ0 to DQ63 to the I/O pins connected to the portion external to the memory module MMa. Then, the memory module MMa performs the memory operation such as the writing and reading of data into and from the memory cells in the memory devices MD0 to MD7 and the refresh operation.

In the testing operation, on the other hand, the same 1-bit data (e.g., "1") is written into all of the memory cells in the memory devices MD0 to MD7. Then, the testing operation enable signal TME is activated, and the switch groups SD0a to SD7a connect all of the data lines DQ0 to DQ63 to the inputs of the exclusive NOR circuit EXa. The exclusive NOR circuit EXa performs an exclusive OR operation on the data outputted from the data lines DQ0 to DQ63, inverts the result of the exclusive OR operation, and outputs the inverted result.

In the event of imperfect interconnect formation or a data read and write malfunction in the memory devices MD0 to MD7, there is a high possibility that data other than "1" appears on one of the data lines DQ0 to DQ63. Therefore, the memory devices MD0 to MD7 are judged as being normal when the output signal TMSa from the exclusive NOR circuit EXa is "1," i.e., all inputs to the exclusive NOR circuit EXa are the same 1-bit data. On the other hand, the memory devices MD0 to MD7 are judged as being defective when the output signal TMSa from the exclusive NOR circuit EXa is "0." In this manner, whether the memory devices are good or not is examined.

The use of this technique allows an inexpensive tester including a single comparator to conduct an electrical assembly check and a simple data write and read operation test on all of the memory devices.

Although the exclusive NOR circuit is used in the first preferred embodiment, an exclusive OR circuit may be used instead. In this case, only the output signal TMSa has an inverted logic, and the judgement as to whether the memory devices are good or not should be made in inverted fashion. In either case, the exclusive OR of the data outputted from the data lines DQ0 to DQ63 is calculated.

Figure 15:
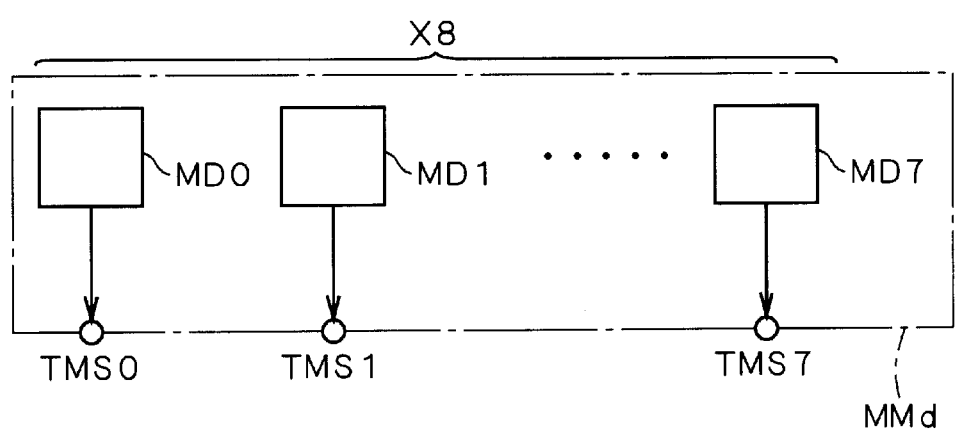
FIG. 15 shows a memory module in which the memory device including the prior art testing mechanism is simply mounted.

Advantages of the memory module of the first preferred embodiment over the memory module MMd of FIG. 15 in which the memory device disclosed in Japanese Patent Application Laid-Open Nos. P61-261895A and P61-292300A is simply mounted will be discussed below.

The memory module of the first preferred embodiment need not connect a test signal line connected to the external portion to each of the memory devices MD0 to MD7, but is only required to observe the output from the exclusive NOR circuit EXa. Therefore, all of the memory devices in the memory module can be tested using an inexpensive tester including a single comparator.

Additionally, since no testing circuit is provided in the memory devices, the test may be conducted on the entire device including a circuit used only during the memory operation, and the chip size of the memory devices themselves is not increased.

Further, in the memory operation, the switch groups SD0a to SD7a disconnect the memory devices MD0 to MD7 from the exclusive NOR circuit EXa to prevent the input load of the exclusive NOR circuit EXa from being imposed on the data lines DQ0 to DQ63. Moreover, the deterioration of the data I/O characteristics due to the signal reflection on the data lines DQ0 to DQ63 does not occur.

The use of the memory module of the first preferred embodiment produces effects to be described below. The switch groups SD0a to SD7a connect the data lines DQ0 to DQ63 to the corresponding inputs of the exclusive NOR circuit EXa in the testing operation and connect the data lines DQ0 to DQ63 to the external portion in the memory operation. This allows the electrical assembly check and the simple data write and read operation test to be conducted on the memory devices MD0 to MD7 by observing the output from the exclusive NOR circuit EXa in the testing operation. Additionally, the inputs of the exclusive NOR circuit EXa are not connected to the data lines DQ0 to DQ63 in the memory operation. This prevents an additional load from being imposed on the data lines DQ0 to DQ63, and also prevents signal reflection on the data lines DQ0 to DQ63. Moreover, in the testing operation, whether the memory devices MD0 to MD7 malfunction or not is judged by checking the output from the exclusive NOR circuit EXa after the common 1-bit data is applied to all of the data lines DQ0 to DQ63 and stored in the memory devices MD0 to MD7. Therefore, the electrical assembly check and the simple data write and read operation test are simply conducted on the memory devices.

<Second Preferred Embodiment>

A memory module according to a second preferred embodiment of the present invention is a modification of the memory module MMa according to the first preferred embodiment. More specifically, an exclusive NOR circuit is provided in corresponding relation to each of the memory devices.

Figure 2:
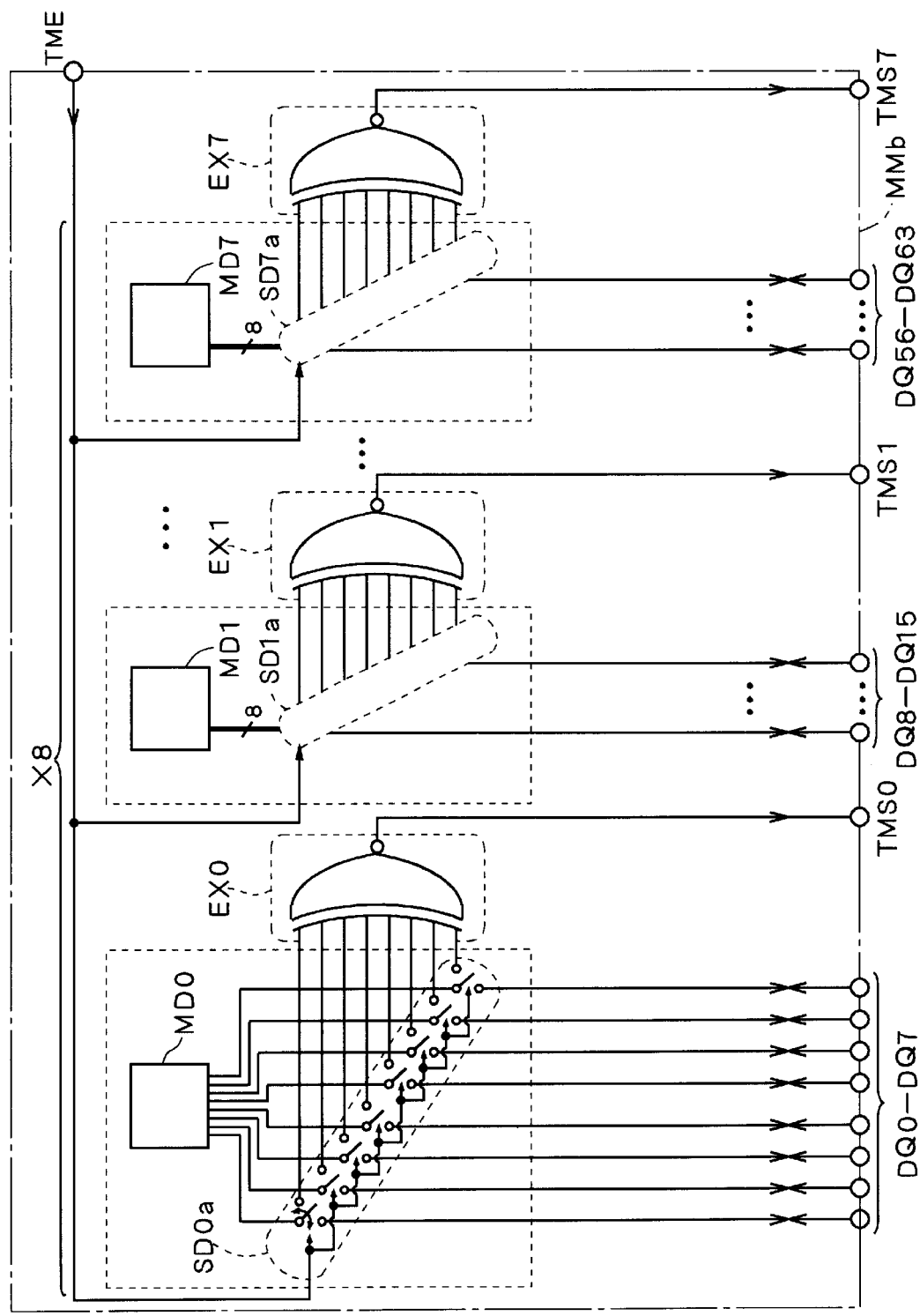
FIG. 2 shows a memory module according to a second preferred embodiment of the present invention.

FIG. 2 shows the memory module MMb according to the second preferred embodiment. In FIG. 2, like reference characters are used to designate components similar in function to those of the memory module MMa of the first preferred embodiment.

As shown in FIG. 2, the memory module MMb comprises exclusive NOR circuits EX0 to EX7 corresponding to the memory devices MD0 to MD7, respectively, in place of the exclusive NOR circuit EXa. More specifically, inputs of the exclusive NOR circuit EX0 are connected to the switch group SD0a corresponding to the data lines DQ0 to DQ7, and inputs of the exclusive NOR circuit EX1 are connected to the switch group SD1a corresponding to the data lines DQ8 to DQ15. Likewise, inputs of each of the exclusive NOR circuits EX2 to EX7 are connected to a corresponding one of the switch groups SD2a to SD7a. The exclusive NOR circuit EX0 to EX7 provide output signals TMS0 to TMS7, respectively.

The remaining structure of the memory module MMb of the second preferred embodiment is similar to that of the memory module MMa of the first preferred embodiment, and thus is not discussed in the second preferred embodiment.

Operation of the memory module MMb will be described hereinafter. In the memory operation, the testing operation enable signal TME is inactive, and the switch groups SD0a to SD7a connect all of the data lines DQ0 to DQ63 to the I/O pins connected to the portion external to the memory module MMb, as in the memory module MMa. Then, the memory operation is performed on the memory devices MD0 to MD7.

In the testing operation, on the other hand, the same 1-bit data (e.g., "1") is written into all of the memory cells in the memory devices MD0 to MD7. Then, the testing operation enable signal TME is activated, and the switch groups SD0a to SD7a connect the data lines DQ0 to DQ63 to the corresponding inputs of the exclusive NOR circuits EX0 to EX7. Each of the exclusive NOR circuits EX0 to EX7 performs an exclusive OR operation on the data outputted from corresponding ones of the data lines DQ0 to DQ63, inverts the result of the exclusive OR operation, and outputs the inverted result.

The memory devices MD0 to MD7 are judged as being normal when all of the output signals TMS0 to TMS7 from the exclusive NOR circuits EX0 to EX7 are "1," i.e., all inputs to the exclusive NOR circuits EX0 to EX7 are the same 1-bit data. On the other hand, the memory devices MD0 to MD7 are judged as being defective when any one of the output signals TMS0 to TMS7 from the exclusive NOR circuits EX0 to EX7 is "0."

Unlike the memory module MMa of the first preferred embodiment, the memory module MMb which comprises the exclusive NOR circuits EX0 to EX7 in corresponding relation to the memory devices MD0 to MD7 cannot use an inexpensive tester having a smaller number of I/O pins. This arrangement, however, allows the recognition of which exclusive NOR circuit provides a defective output, and thereby allows the determination as to which memory device is defective.

<Third Preferred Embodiment>

A memory module according to a third preferred embodiment of the present invention is a modification of the memory module MMa according to the first preferred embodiment. More specifically, the inputs of the exclusive NOR circuit connected to switch groups are grounded in the memory operation.

Figure 3:
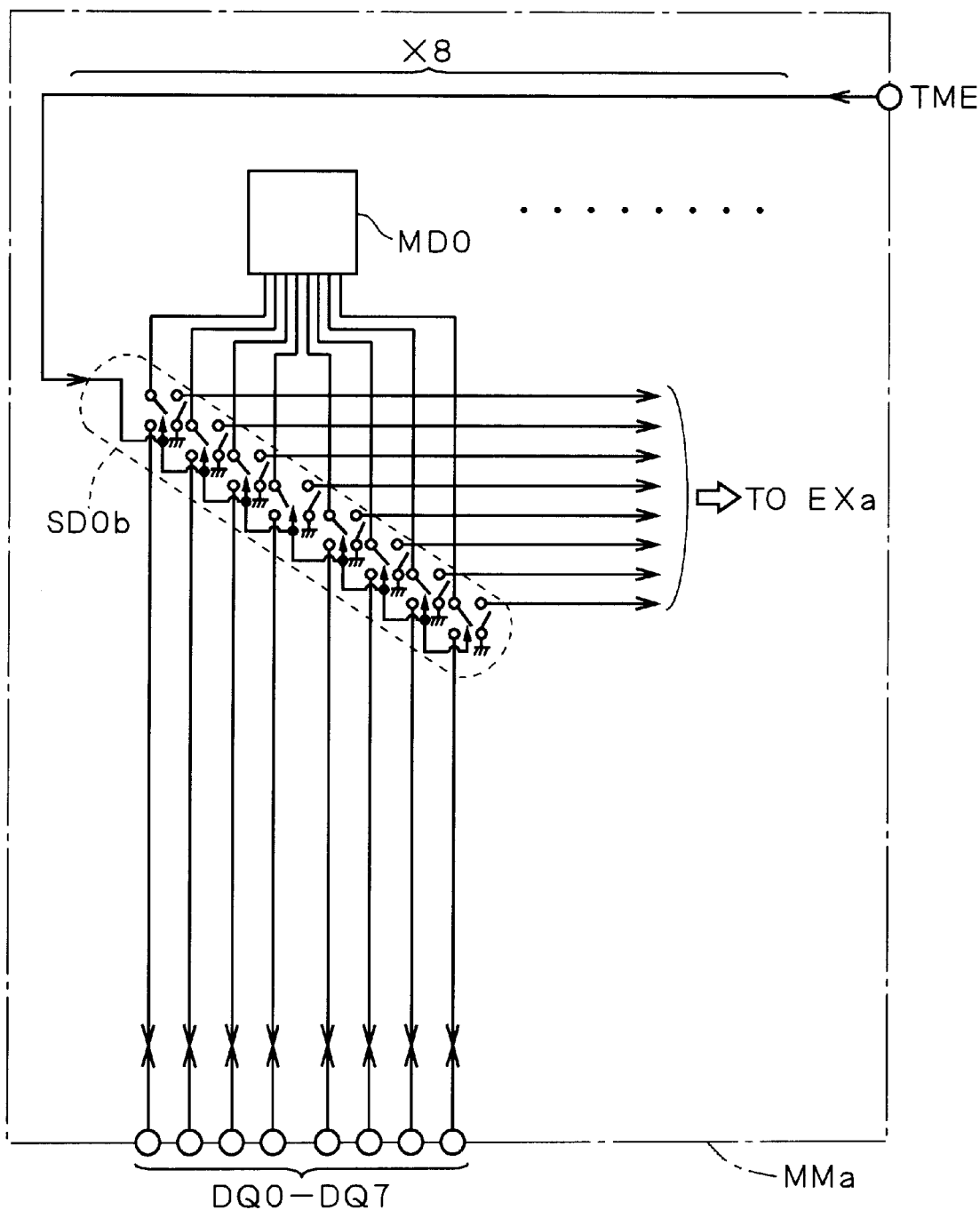
FIG. 3 shows a memory module according to a third preferred embodiment of the present invention.

FIG. 3 shows the memory module according to the third preferred embodiment. As shown in FIG. 3, the memory module according to the third preferred embodiment comprises switch groups SD0b to SD7b in place of the switch groups SD0a to SD7a. The switch groups SD0b to SD7b also have the function of connecting the inputs of the exclusive NOR circuit EXa to a ground potential GND in the memory operation. For purposes of simplification, only the memory device MD0 and its adjacent components are shown in FIG. 3.

The remaining structure of the memory module of the third preferred embodiment is similar to that of the memory module MMa of the first preferred embodiment, and thus is not discussed in the third preferred embodiment.

Operation of the memory module of the third preferred embodiment will be described hereinafter. In the testing operation as illustrated in FIG. 4, the switch groups SD0b to SD7b connect all of the data lines DQ0 to DQ63 to the inputs of the exclusive NOR circuit EXa, as in the memory module MMa of the first preferred embodiment. At this time, the ground potential GND is disconnected from the inputs of the exclusive NOR circuit EXa.

In the memory operation as illustrated in FIG. 5, on the other hand, the switch groups SD0b to SD7b not only connect the data lines DQ0 to DQ63 to the I/O pins but also connect the inputs of the exclusive NOR circuit EXa to the ground potential GND.

Since the switch groups SD0b to SD7b connect the inputs of the exclusive NOR circuit EXa to the ground potential GND in the memory operation, the use of the memory module of the third preferred embodiment suppresses power consumption resulting from a stray capacitance and noise at the inputs of the exclusive NOR circuit EXa.

The third preferred embodiment is also applicable to the memory module of the second preferred embodiment, in which case the switch groups SD0a to SD7a shown in FIG. 2 are replaced with the switch groups SD0b to SD7b.

<Fourth Preferred Embodiment>

A memory module according to a fourth preferred embodiment of the present invention is a modification of the memory module MMa according to the first preferred embodiment. More specifically, the memory module of the fourth preferred embodiment further comprises a control device which outputs the testing operation enable signal when receiving a predetermined combination of operating signals which does not contribute to the memory operation among combinations of operating signals externally applied for the memory operation of the memory devices, thereby to reduce the number of pins for input of the testing operation enable signal.

Many SDRAMs, for example, have a mode register set function as an industry-standard function. The mode register set function is the function of being capable of setting a parameter regarding the memory operation such as a burst length and CAS latency of a memory device at an arbitrary value by inputting to a SDRAM a signal combination which specifies "NOP (No Operation)" indicative of non-execution of the memory operation. In the SDRAM having the mode register set function, the memory device performs the memory operation when the operating signal is in a predefined significant condition, and the parameter regarding the memory operation is set by the mode register set function when the operating signal is in a predetermined condition other than the significant condition.

Figure 6:
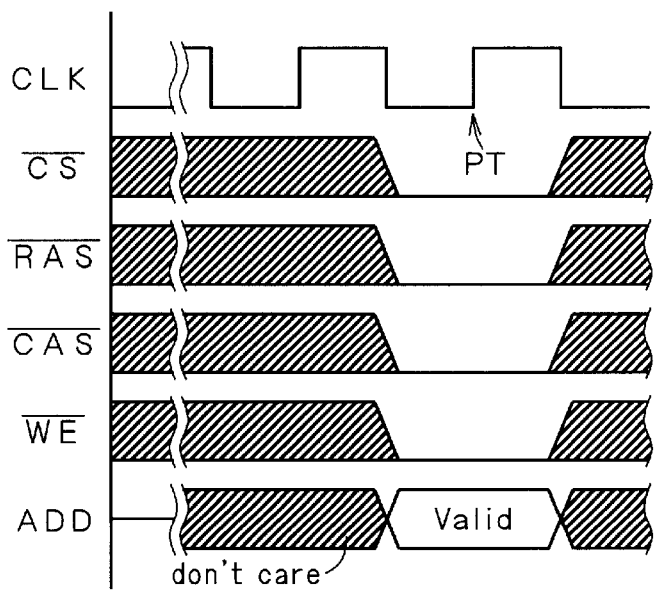
FIG. 6 illustrates a mode register set function of a SDRAM.

More specifically, as illustrated in FIG. 6, the parameter regarding the memory operation of the memory device is set at an arbitrary value depending on the combination of address signals ADD obtained when, for example, a chip select signal $\overline{CS}$, a row address strobe signal $\overline{RAS}$, a column address strobe signal $\overline{CAS}$ and a write enable signal $\overline{WE}$ (all of which are assumed to be active-low) are all at a "low" signal level. It is assumed in the diagram of FIG. 6 that the SDRAM receives a signal on a rising edge PT of a clock signal CLK. Such a mode register set function is implemented by a purpose-built circuit provided on the SDRAM.

Figure 7:
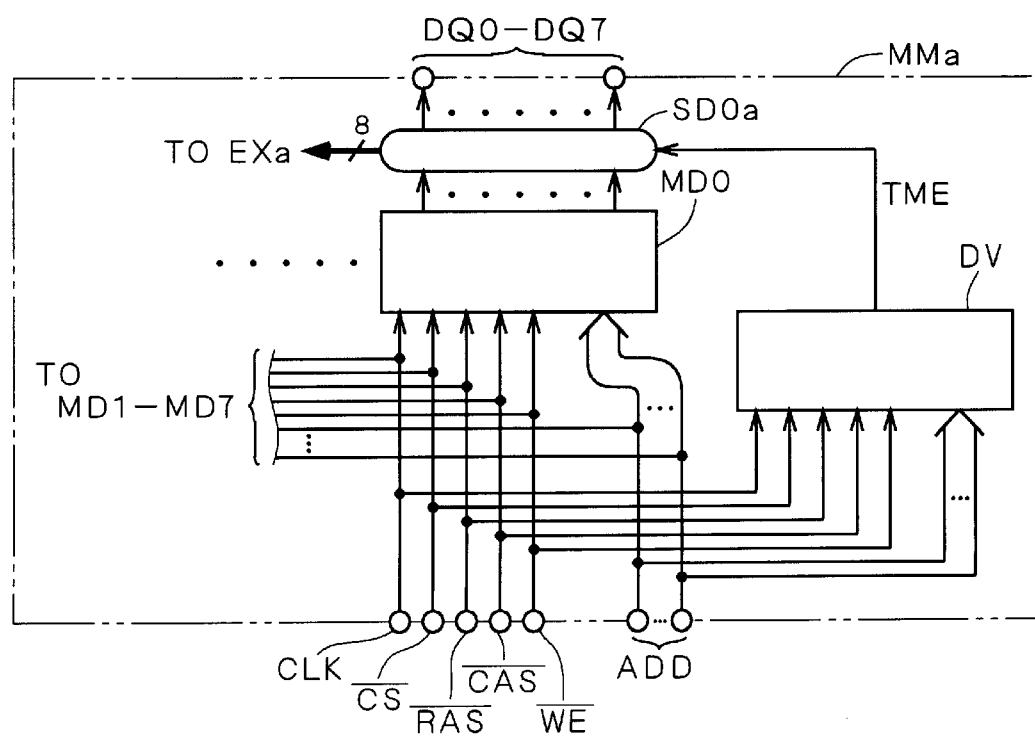
FIG. 7 shows a memory module according to a fourth preferred embodiment of the present invention.

In the fourth preferred embodiment, the mode register set function is applied to use the signal combination which specifies "NOP" for the memory devices to generate the testing operation enable signal TME. More particularly, as shown in FIG. 7, the memory module MMa further comprises a control device DV having the mode register set function. The control device DV generates the testing operation enable signal TME. For purposes of simplification, only the memory device MD0 and its adjacent components are shown in FIG. 7.

The control device DV is similar to the purpose-built circuit provided on the SDRAM. The control device DV receives the operating signals $\overline{CLK}, \overline{CS}, \overline{RAS}, \overline{CAS}, \overline{WE}$ and ADD to be applied to the memory devices MD0 to MD7. The control device DV is designed to output the testing operation enable signal TME to the switch groups SD0a to SD7a upon receiving a predetermined combination of operating signals which does not contribute to the memory operation among combinations of the above-mentioned operating signals. This permits effective use of the predetermined combination of operating signals which does not contribute to the memory operation. The control device DV should be designed to maintain the testing operation enable signal TME inactive when a signal other than the predetermined combination of operating signals is inputted thereto.

The remaining structure of the memory module of the fourth preferred embodiment is similar to that of the memory module MMa of the first preferred embodiment, and thus is not discussed in the fourth preferred embodiment.

The use of the memory module of the fourth preferred embodiment produces effects to be described below. The control device DV outputs to the switch groups SD0a to SD7a the testing operation enable signal TME for connecting the data lines DQ0 to DQ63 to the corresponding inputs of the exclusive NOR circuit EXa when the predetermined combination of operating signals which does not contribute to the memory operation is inputted thereto. This eliminates the need for the memory module to have the pins for input of the testing operation enable signal TME, thereby to suppress the increase in the number of pins of the memory module. Consequently, the reduction in the number of interconnect lines of a system board to which the memory module is to be connected is also achieved.

The fourth preferred embodiment is also applicable to the memory module of the second preferred embodiment. In this case, the memory module shown in FIG. 2 should comprise the control device DV designed to receive the operation signals to output the testing operation enable signal TME, in place of receiving the testing operation enable signal TME from the external portion.

<Fifth Preferred Embodiment>

A memory module according to a fifth preferred embodiment of the present Invention is a modification of the memory module MMa according to the first preferred embodiment. More specifically, arbitrary 1-bit data serving as an expected value signal is also inputted to the exclusive NOR circuit. In the memory module according to the first and second preferred embodiments, it is impossible to detect an error such that all of the signals on the data lines DQ0 to DQ63 are inverted. However, such an error is correctly detected by inputting to the exclusive NOR circuit the expected value signal which is a logic the same as that written into the memory cells of the memory devices.

FIG. 8 shows the memory module according to the fifth preferred embodiment. For purposes of simplification, only the exclusive NOR circuit EXa and its adjacent components are shown in FIG. 8. In the memory module of the fifth preferred embodiment, the exclusive NOR circuit EXa has an additional input for receiving the expected value signal ES which is arbitrary 1-bit data, in addition to the 64 inputs connected to the switch groups SD0a to SD7a. The expected value signal ES has the same logic as the logic "1" or "0" written into the memory cells of the memory devices MD0 to MD7 in the testing operation.

The remaining structure of the memory module of the fifth preferred embodiment is similar to that of the memory module MMa of the first preferred embodiment, and thus is not discussed in the fifth preferred embodiment.

The use of the memory module of the fifth preferred embodiment produces an effect to be described below. The exclusive NOR circuit EXa further includes the additional input which can receive the arbitrary 1-bit data. Therefore, the memory devices can be tested for malfunction, based on whether or not all of the outputs from the data lines DQ0 to DQ63 coincide with the arbitrary 1-bit data applied to the additional input even in the event of a malfunction such that all of the outputs from the data line DQ0 to DQ63 are inverted.

The fifth preferred embodiment is also applicable to the memory module of the second preferred embodiment, in which case the expected value signal ES is inputted to each of the exclusive NOR circuits EX0 to EX7 shown in FIG. 2.

<Sixth Preferred Embodiment>

A memory module according to a sixth preferred embodiment of the present invention is a modification of the memory module MMa according to the first preferred embodiment. More specifically, the switch groups SD0a to SD7a further have a bus switch function.

The bus switch, as that term is used herein, is a switch provided for disconnecting the memory devices MD0 to MD7 from a data bus connected to the data lines DQ0 to DQ63 and external to the memory module. A memory device unselected in response to the chip select signal $\overline{CS}$ which is inactive during the memory operation is disconnected from the data bus by the bus switch. This reduces the load on the data bus to achieve a high speed operation. A signal (referred to hereinafter as a bus switch signal) for controlling the bus switch is outputted from the memory devices, and is often referred to as QFC or FETEN.

Figure 9:
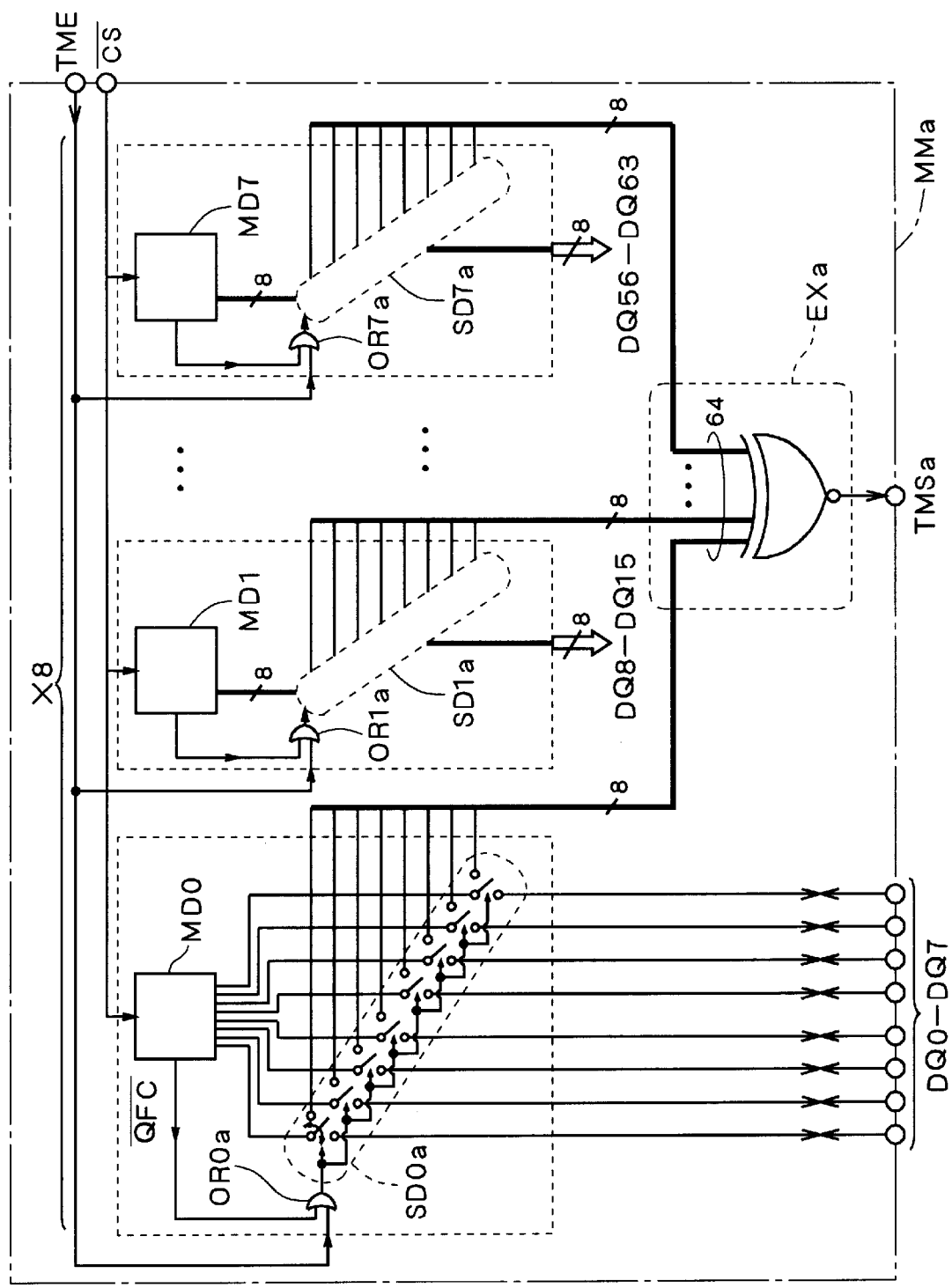
FIG. 9 shows a memory module according to a sixth preferred embodiment of the present invention.

FIG. 9 shows the memory module according to the sixth preferred embodiment of the present invention. In the memory module of the sixth preferred embodiment, the testing operation enable signal TME (assumed to be active-high) and the bus switch signal $\overline{QFC}$ (assumed to be active-low) from each of the memory devices MD0 to MD7 are inputted through a corresponding one of OR circuits OR0a to OR7a to a corresponding one of the switch groups SD0a to SD7a. The bus switch signal $\overline{QFC}$ is outputted from a memory device which receives the chip select signal $\overline{CS}$ which is inactive during the memory operation.

Figures 10, 11:
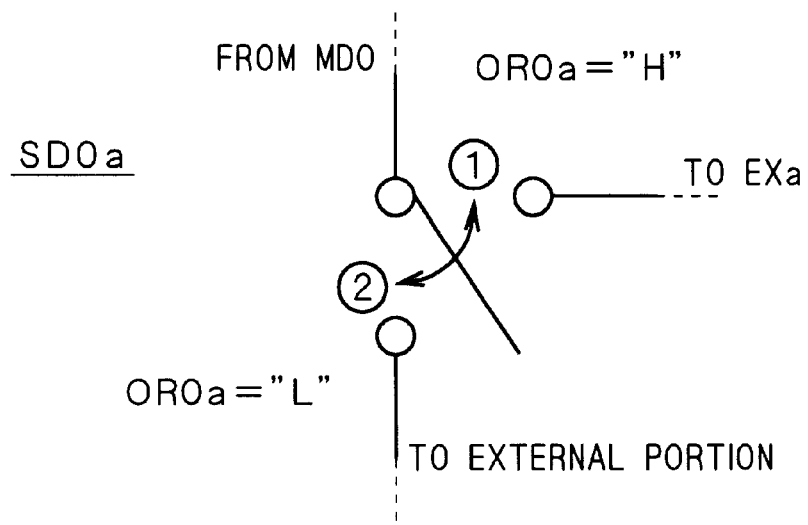
FIGS. 10 and 11 show the operation of a switch group SD0*a* in the memory module according to the sixth preferred embodiment.
Figure 13:
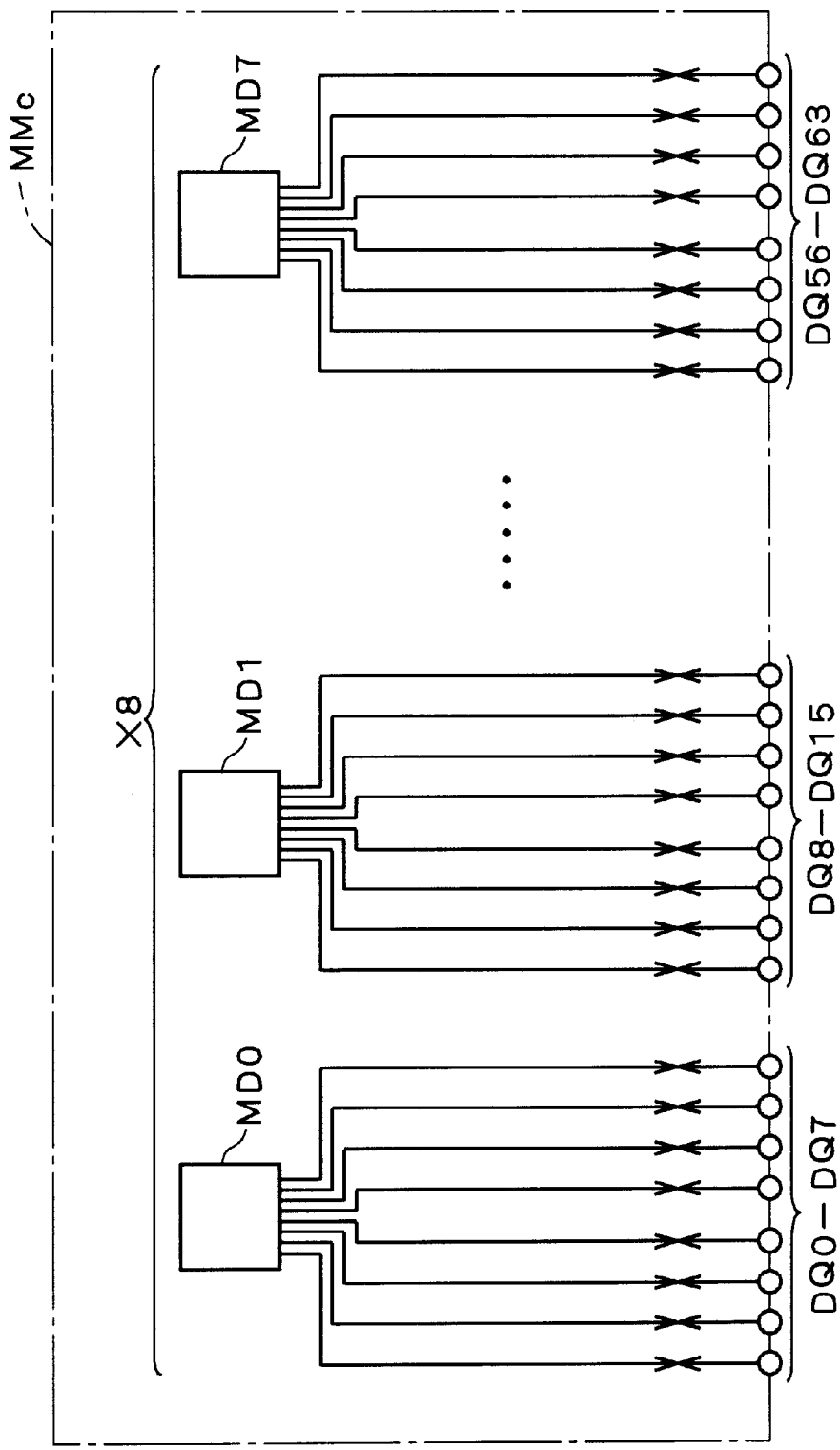
FIG. 13 shows a background art memory module.
Figure 14:
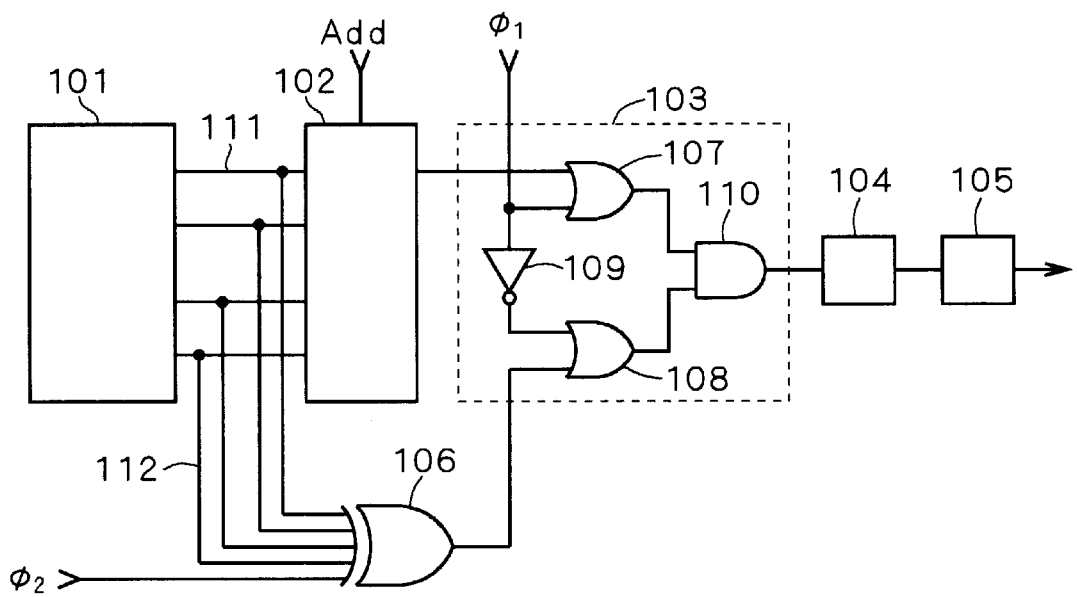
FIG. 14 shows a memory device including a prior art testing mechanism.

The OR circuits OR0a to OR7a output a "low" when both of the testing operation enable signal TME and the bus switch signal $\overline{QFC}$ are "low." Upon receipt of the "low" output from the OR circuits OR0a to OR7a, the switch groups SD0a to SD7a connect the data lines DQ0 to DQ63 to the portion external to the memory module MMa as indicated by the direction ② of FIG. 10.

On the other hand, the OR circuits OR0a to OR7a output a "high" when one of the testing operation enable signal TME and the bus switch signal $\overline{QFC}$ is "high." Upon receipt of the "high" output from the OR circuit OR0a to OR7a, the switch groups SD0a to SD7a connect the data lines DQ0 to DQ63 to the inputs of the exclusive NOR circuit EXa as indicated by the direction ① of FIG. 10. The table shown in FIG. 11 provides a summary of the above described operations.

The remaining structure of the memory module of the sixth preferred embodiment is similar to that of the memory module MMa of the first preferred embodiment, and thus is not discussed in the sixth preferred embodiment.

The use of the memory module of the sixth preferred embodiment produces effects to be described below. The memory devices MD0 to MD7 provide the bus switch signal $\overline{QFC}$ to the switch groups SD0a to SD7a so that the data lines DQ0 to DQ63 are not connected to the external portion when the chip select signal $\overline{CS}$ is inactive. This eliminates the need to additionally provide a separate bus switch. In other words, the switch groups SD0a to SD7a function as the bus switch when the memory module is mounted on the system board and performs the memory operation, and function as the switch operable in response to the testing operation enable signal TME when the memory module is evaluated by a tester. Furthermore, since the switch groups SD0a to SD7a are controlled by the outputs from the OR circuit OR0a to OR7a respectively, each of the switch groups need not receive both of the testing operation enable signal TME and the bus switch signal $\overline{QFC}$ individually, but receives a single instruction.

<Seventh Preferred Embodiment>

A memory module according to a seventh preferred embodiment of the present invention is a modification of the memory module according to the second preferred embodiment. More specifically, the switch groups SD0a to SD7a further have a bus switch function, as described in the sixth preferred embodiment.

FIG. 12 shows the memory module according to the seventh preferred embodiment of the present invention. In the memory module of the seventh preferred embodiment, the testing operation enable signal TME (assumed to be active-high) and the bus switch signal $\overline{QFC}$ (assumed to be active-low) from each of the memory devices MD0 to MD7 are inputted through a corresponding one of the OR circuits OR0a to OR7a to a corresponding one of the switch groups SD0a to SD7a. The bus switch signal $\overline{QFC}$ is outputted from a memory device which receives the chip select signal $\overline{CS}$ which is inactive during the memory operation.

The remaining structure of the memory module of the seventh preferred embodiment is similar to that of the memory module of the second preferred embodiment, and thus is not discussed in the seventh preferred embodiment.

The memory module of the seventh preferred embodiment is similar in operation to the memory module of the sixth preferred embodiment. The OR circuits OR0a to OR7a output a "low" when both of the testing operation enable signal TME and the bus switch signal $\overline{QFC}$ are "low." Upon receipt of the "low" output from the OR circuits OR0a to OR7a, the switch groups SD0a to SD7a connect the data lines DQ0 to DQ63 to the portion external to the memory module MMb. On the other hand, the OR circuits OR0a to OR7a output a "high" when one of the testing operation enable signal TME and the bus switch signal $\overline{QFC}$ is "high." Upon receipt of the "high" output from the OR circuit OR0a to OR7a, the switch groups SD0a to SD7a connect the data lines DQ0 to DQ63 to the inputs of the exclusive NOR circuits EX0 to EX7.

The use of the memory module of the seventh preferred embodiment produces effects similar to those of the sixth preferred embodiment.

While the invention has been described in detail, the foregoing description is in all aspects illustrative and not restrictive. It is understood that numerous other modifications and variations can be devised without departing from the scope of the invention.

What is claimed is:

1. A memory module comprising:
   at least one memory device connected to at least one data line for bit-wise transmitting and receiving data to and from an external portions;
   an exclusive OR element having at least one input corresponding to said at least one data line; and
   at least one switch for connecting said at least one data line to either said external portion or said at least one input of said exclusive OR element,
   wherein said at least one switch receives a first instruction for causing said at least one switch to connect said at least one data line to said at least one input of said exclusive OR element in a testing operation and causing said at least one switch to connect said at least one data line to said external portion in a memory operation.

2. The memory module according to claim 1,
   wherein, in said testing operation,
   common 1-bit data is applied to said at least one data line and stored in said at least one memory device before said first instruction causes said at least one switch to connect said at least one data line to said at least one input of said exclusive OR element, and
   thereafter whether said at least one memory device malfunctions or not is judged by checking an output from said exclusive OR element.

3. The memory module according to claim 1,
   wherein at least one memory device includes a plurality of memory devices, and
   wherein said exclusive OR element and said at least one switch are provided in corresponding relation to each of said plurality of memory devices.

4. The memory module according to claim 3,
   wherein said at least one switch further connects said at least one input of said exclusive OR element to a fixed potential in said memory operation.

5. The memory module according to claim 3,
   wherein an operating signal for controlling said plurality of memory devices is inputted from said external portion to said plurality of memory devices; and
   wherein said plurality of memory devices perform said memory operation when said operating signal is in a pre-defined significant condition,
   said memory module further comprising
   control means for providing said first instruction to said at least one switch, said control means placing said at least one switch into a condition achieved in said testing operation when said operating signal is in a predetermined condition other than said significant condition.

6. The memory module according to claim 5,
   wherein said operating signal includes a plurality of operating signals; and
   wherein said control means places said at least one switch into said condition achieved in said testing operation when a predetermined one of combinations of said plurality of operating signals which does not contribute to said memory operation is inputted to said control means.

7. The memory module according to claim 3,
   wherein said exclusive OR element further has another input capable of receiving arbitrary 1-bit data.

8. The memory module according to claim 3,
   wherein an operating signal for selecting said plurality of memory devices is inputted from said external portion to said plurality of memory devices; and
   wherein an unselected one of said plurality of memory devices provides a second instruction to said at least one switch to prevent said at least one data line from being connected to said external portion.

9. The memory module according to claim 8, further comprising
   an OR element receiving said first and second instructions,
   wherein said OR element is provided in corresponding relation to each of said plurality of memory devices; and
   wherein said at least one switch is controlled by an output from said OR element.

10. The memory module according to claim 1,
    wherein said at least one switch further connects said at least one input of said exclusive OR element to a fixed potential in said memory operation.

11. The memory module according to claim 1, wherein an operating signal for controlling said at least one memory device is inputted from said external portion to said at least one memory device; and wherein said at least one memory device performs said memory operation when said operating signal is in a pre-defined significant condition, said memory module further comprising control means for providing said first instruction to said at least one switch, said control means placing said at least one switch into a condition achieved in said testing operation when said operating signal is in a predetermined condition other than said significant condition.

12. The memory module according to claim 11, wherein said operating signal includes a plurality of operating signals; and wherein said control means places said at least one switch into said condition achieved in said testing operation when a predetermined one of combinations of said plurality of operating signals which does not contribute to said memory operation is inputted to said control means.

13. The memory module according to claim 1, wherein said exclusive OR element further has another input capable of receiving arbitrary 1-bit data.

14. The memory module according to claim 1, wherein an operating signal for selecting said at least one memory device is inputted from said external portion to said at least one memory device; and wherein an unselected one of said at least one memory device provides a second instruction to said at least one switch to prevent said at least one data line from being connected to said external portion.

15. The memory module according to claim 14, further comprising an OR element receiving said first and second instructions, wherein said at least one switch is controlled by an output from said OR element.

16. A memory module comprising:

a memory device receiving an operating signal for controlling the operation of said memory device inputted from an external portion to said memory device wherein said memory device performs a memory operation when said operating signal is in a pre-defined significant condition; and a control means configured to receive said operating signal and output a signal to enable a predetermined operation of said memory device differing from said memory operation when said operating signal is in a predetermined condition other than said significant condition.

17. The memory module according to claim 16, wherein said operating signal includes a plurality of operating signals; and wherein said control means outputs said signal regarding said predetermined operation when a predetermined one of combinations of said plurality of operating signals which does not contribute to said memory operation is inputted to said control means.

* * * * *